United States Patent
Schilp et al.

(10) Patent No.: US 10,646,972 B2
(45) Date of Patent: May 12, 2020

(54) DEVICE FOR TREATING OR MACHINING A SURFACE

(71) Applicant: ZS-HANDLING GMBH, Regensburg (DE)

(72) Inventors: Michael Schilp, Garching (DE); Josef Zimmermann, Regensburg (DE); Adolf Zitzmann, Teunz (DE)

(73) Assignee: ZS-Handling GmbH, Regensburg (DE)

( * ) Notice: Subject to any disclaimer, the term of this patent is extended or adjusted under 35 U.S.C. 154(b) by 0 days.

(21) Appl. No.: 14/906,803

(22) PCT Filed: Jul. 22, 2014

(86) PCT No.: PCT/DE2014/000374
§ 371 (c)(1),
(2) Date: May 13, 2016

(87) PCT Pub. No.: WO2015/010680
PCT Pub. Date: Jan. 29, 2015

(65) Prior Publication Data
US 2016/0250728 A1    Sep. 1, 2016

(30) Foreign Application Priority Data
Jul. 22, 2013   (DE) .......................... 10 2013 012 173

(51) Int. Cl.
*B23K 26/362*   (2014.01)
*G01N 21/25*    (2006.01)
(Continued)

(52) U.S. Cl.
CPC .............. *B23Q 1/38* (2013.01); *B05C 5/0295* (2013.01); *B08B 7/028* (2013.01); *B23K 20/10* (2013.01);
(Continued)

(58) Field of Classification Search
None
See application file for complete search history.

(56) References Cited

U.S. PATENT DOCUMENTS

| | | | |
|---|---|---|---|
| 4,485,387 A | 11/1984 | Drumheller et al. | |
| 4,520,049 A | 5/1985 | Nakanishi et al. | |

(Continued)

FOREIGN PATENT DOCUMENTS

| | | | |
|---|---|---|---|
| DE | 199 38 328 A1 | 2/2001 | |
| DE | 100 59 232 A1 | 6/2002 | |

(Continued)

OTHER PUBLICATIONS

International Search Report issued by the European Patent Office in International Application PCT/DE2014/000374.

*Primary Examiner* — Jethro M. Pence
(74) *Attorney, Agent, or Firm* — Henry M. Feiereisen LLC

(57) ABSTRACT

A device for treating or acting on workpiece surfaces by means of an actuator, such as a cutting or engraving laser or a nozzle for applying oils, paints, adhesives, dyes, or etchants is disclosed. An ultrasonic levitation force field is generated by means of a sonotrode, which is coupled to the actuator into a working unit, such that the movably suspended working unit is supported on the workpiece surface in a hovering manner. The ultrasonic levitation force field allows a highly precise positioning of the working unit relative to the workpiece surface so as to allow a precise treatment or machining of the workpiece surface.

6 Claims, 9 Drawing Sheets

(51) Int. Cl.
  *G01N 27/02* (2006.01)
  *G01N 27/22* (2006.01)
  *B23Q 1/38* (2006.01)
  *B23K 26/08* (2014.01)
  *B23K 26/38* (2014.01)
  *B05C 5/02* (2006.01)
  *H01J 37/32* (2006.01)
  *B08B 7/02* (2006.01)
  *B23K 20/10* (2006.01)
  *G10K 15/00* (2006.01)
  *B23K 26/40* (2014.01)
  *B23K 26/361* (2014.01)
  *B05B 13/02* (2006.01)
  *B05C 19/04* (2006.01)
  *B23K 103/00* (2006.01)
  *B23K 101/16* (2006.01)

(52) U.S. Cl.
  CPC .......... *B23K 26/083* (2013.01); *B23K 26/361* (2015.10); *B23K 26/362* (2013.01); *B23K 26/38* (2013.01); *B23K 26/40* (2013.01); *G01N 21/25* (2013.01); *G01N 27/02* (2013.01); *G01N 27/22* (2013.01); *G10K 15/00* (2013.01); *H01J 37/3277* (2013.01); *B05B 13/0278* (2013.01); *B05C 19/04* (2013.01); *B23K 2101/16* (2018.08); *B23K 2103/50* (2018.08)

(56) References Cited

U.S. PATENT DOCUMENTS

| | | | |
|---|---|---|---|
| 4,934,103 A * | 6/1990 | Campergue | B24B 1/04 451/165 |
| 6,361,610 B1 * | 3/2002 | Scotto | B08B 5/00 134/1 |
| 6,533,866 B1 | 3/2003 | Franz et al. | |
| 7,260,449 B2 | 8/2007 | Zimmermann et al. | |
| 7,870,946 B2 | 1/2011 | Zimmermann et al. | |
| 8,794,877 B2 | 8/2014 | Schilp et al. | |
| 8,836,933 B2 | 9/2014 | Schilp et al. | |
| 2008/0282756 A1 * | 11/2008 | Cheppe | B24C 1/10 72/53 |
| 2011/0311320 A1 | 12/2011 | Schilp et al. | |
| 2012/0274011 A1 | 11/2012 | Schilp et al. | |
| 2012/0327402 A1 | 12/2012 | Schilp et al. | |
| 2014/0041186 A1 | 2/2014 | Schilp et al. | |
| 2015/0015013 A1 | 1/2015 | Schilp et al. | |
| 2016/0163307 A1 * | 6/2016 | Gstoettenbauer | G01B 5/0002 73/866.5 |

FOREIGN PATENT DOCUMENTS

DE 10 2007 047 298 B3 4/2009
DE 10 2007 052 530 A1 5/2009
DE 10 2010 027 031 A1 1/2012

* cited by examiner

DEVICE FOR TREATING OR MACHINING A SURFACE

CROSS-REFERENCES TO RELATED APPLICATIONS

This application is the U.S. National Stage of International Application No. PCT/DE2014/000374, filed Jul. 22, 2014, which designated the United States and has been published as International Publication No. WO 2015/010680 A2 and which claims the priority of German Patent Application, Serial No. 10 2013 012 173.6, filed Jul. 22, 2013, pursuant to 35 U.S.C. 119(a)-(d).

BACKGROUND OF THE INVENTION

The invention relates to a device for the treatment of or for action on workpiece surfaces by means of an actuator, such as a laser for cutting or engraving, a nozzle for applying oils, varnishes, adhesives, paints, etchants, releasing agents, etc. The invention in particular relates to a device which is suitable for working on workpieces with relatively large surfaces—in relation to the dimensions of the actuator—such as on belt materials.

Systems are known from the prior art that allow the working range of an actuator to accurately adjust in the x-, y-, and z-direction relative to the workpiece surface. Cross beams, for example, which are coupled with length measurement devices are used for the adjustment of an actuator in the x-y direction. Such systems are hereinafter referred to as linear drives.

Depending on the process of surface treatment or on the effect of a treatment on the surface, different high accuracies in the positioning of the actuator are required.

Various constructions are known for the positioning of an actuator with respect to a workpiece surface. It is especially known from the prior art to position the actuator with the technologically required accuracy and to guide it over the workpiece surface in order to process it by means of sensors which measure lengths and distances. Certain conditions must therefore be complied with, such as the positioning accuracy, the controllability, the weight of the actuator, the volume of construction or the lowest possible production cost of construction used for the positioning of the actuator.

Basically, it is required that the positioning system does not influence the processing process to be carried out by the actuator, i.e., does not interfere. If the distance of an actuator to the workpiece surface is to be monitored, that can be done with a tactile operating measuring system which has a wheel at its front end that rolls on the workpiece surface. However, mechanical scanning is possible only for a relatively solid surface. Distance sensors which scan the workpiece surface without contact are used with touch-sensitive surfaces, such as capacitive and inductive distance sensors or even dynamic pressure nozzles that operate pneumatically. However, these sensors can interfere with the processing process or can be disturbed by the processing process. Thus, the gas emerging from the dynamic pressure nozzle, usually compressed air, generates turbulence in the vicinity of a paint spray nozzle. Such interference may also occur in the application of etchants, varnishes or low-viscosity adhesives. Thus, the air flow of a dynamic pressure nozzle could also swirl the protective gas during gas-shielded welding.

Furthermore, it should be noted that the solid, liquid or gaseous substances released by the actuator or even substances arising from the treatment of the workpiece surface can influence the measurement accuracy of the distance sensors. When process fluids reach into the range of, for example, measuring electrodes, the distance measuring signals are distorted.

These problems can then be remedied if the measuring system for measuring the distance between the actuator and the material surface is spatially separated from the actuator. However, a measuring system arranged far away from the actuator generates greater measurement error than a measuring system arranged directly on the actuator. In addition, increased device-related effort is necessary in order to reduce the measurement error.

Devices and methods are described in the documents DE 10059232 C2, DE 19938328 C2, DE 102010027031 A1 and DE 102007047298 B3 that position a work unit at a predetermined distance above a workpiece surface by means of a sensor arrangement.

SUMMARY OF THE INVENTION

The object of the invention is to provide a device for surface treatment or processing which is equipped with a structure for the positions of the actuator in order to precisely position the actuator at a predetermined distance with respect to a workpiece surface to be treated or processed. In particular, this structure should not interfere with the process of the surface treatment or surface processing.

This object is solved with a device for surface treatment or processing according to claim 1 with the following characteristics:
- an actuator for acting on a workpiece surface or for processing a workpiece surface,
- at least one sonotrode which has a sound radiating surface and is mechanically rigidly connected to the actuator in order to form a work unit, and
- a movable positioning device coupled with the work unit for positioning the work unit in a position opposite to the workpiece surface, wherein the positioning device has means of pushing which pushes the work unit with a predetermined force in the direction of the workpiece surface. Means of pushing is understood to be all technical means which are suitable to push the work unit against the workpiece surface by means of a predetermined pushing force. The pushing force can be generated by a mechanical spring, by a controlled mechanical drive, a hydraulic or a pneumatic drive, but also by magnetic attraction or repulsion as well as by a gravitational force caused by a mass or by a vacuum.

Further, the sound radiating surface of the sonotrode is designed to perform such ultrasonic oscillations that in the presence of a gaseous medium between the workpiece surface and the sound radiating surface, an ultrasonic levitation force field takes effect, which generates an opposing force directed against the pushing force, whereby the work unit is held objected to the workpiece surface.

The actuator is designed in order to apply liquid, pasty, powdery or aerosol-like media to the workpiece surface or to generate electrical, magnetic or electromagnetic fields on the workpiece surface and to change these or in order to generate an ultrasonic field to act upon the workpiece surface or in order to remove material from these by applying mechanical means to the workpiece surface.

The advantage of this device is that the ultrasonic levitation force field does not have a noticeable effect on the solid, liquid or gaseous substances either used or released when treating or processing the surface. Thus, the process of surface treatment or surface processing is not disturbed.

According to another advantageous feature of the invention, process monitoring sensors for process monitoring or for process control are arranged on the work unit. This makes it possible to quickly recognize and correct the errors that may have arisen in the surface treatment or surface processing. This is particularly advantageous when very long belt-shaped materials which are to be subsequently wound, such as sheet steel or plastic film, are to be processed or treated. Based on the movement of the belt-shaped material, the process monitoring sensors are arranged behind the work unit and connected rigidly to this. Through this, these process monitoring sensors are also positioned exactly as the work unit itself, so that measurement errors that could occur through fluctuations in distance to the workpiece or material surface can be avoided.

According to another advantageous feature of the invention, the process monitoring sensors are optical sensors, which provide image signals of the treated or processed workpiece surface. These image signals are connected to image recognition systems, which, for example, can already show slight color variations of a varnishing.

According to another advantageous feature of the invention, the process monitoring sensors are capacitive sensors which provide as electrical measurement signals the changes in capacitance of the workpiece surface being treated or processed caused by the treatment or processing of the surface.

According to another advantageous feature of the invention, the process monitoring sensors are inductive sensors 5, which provide as electrical measurement signals the changes in inductance of the workpiece surface being treated or processed caused by the treatment or processing of the surface.

According to another advantageous feature of the invention the process monitoring sensors are based on a work movement before and behind the work unit. This arrangement allows a comparison of the unprocessed or untreated workpiece surface with the processed or treated workpiece surface.

According to another advantageous feature of the invention, the process monitoring sensors are based on a work movement of the workpiece or of the material arranged behind the work unit. A second processing unit is arranged behind these process monitoring sensors. With this arrangement, for example, subsequent corrections are possible, if it is determined that the result of the surface treatment or processing must be corrected by the first processing unit.

According to another advantageous feature of the invention, a distance control for controlling the distance between the workpiece surface and the work unit is provided. This is achieved by an increase or a reduction of the acoustic energy.

DETAILED DESCRIPTION OF PREFERRED EMBODIMENTS

Figure 1:
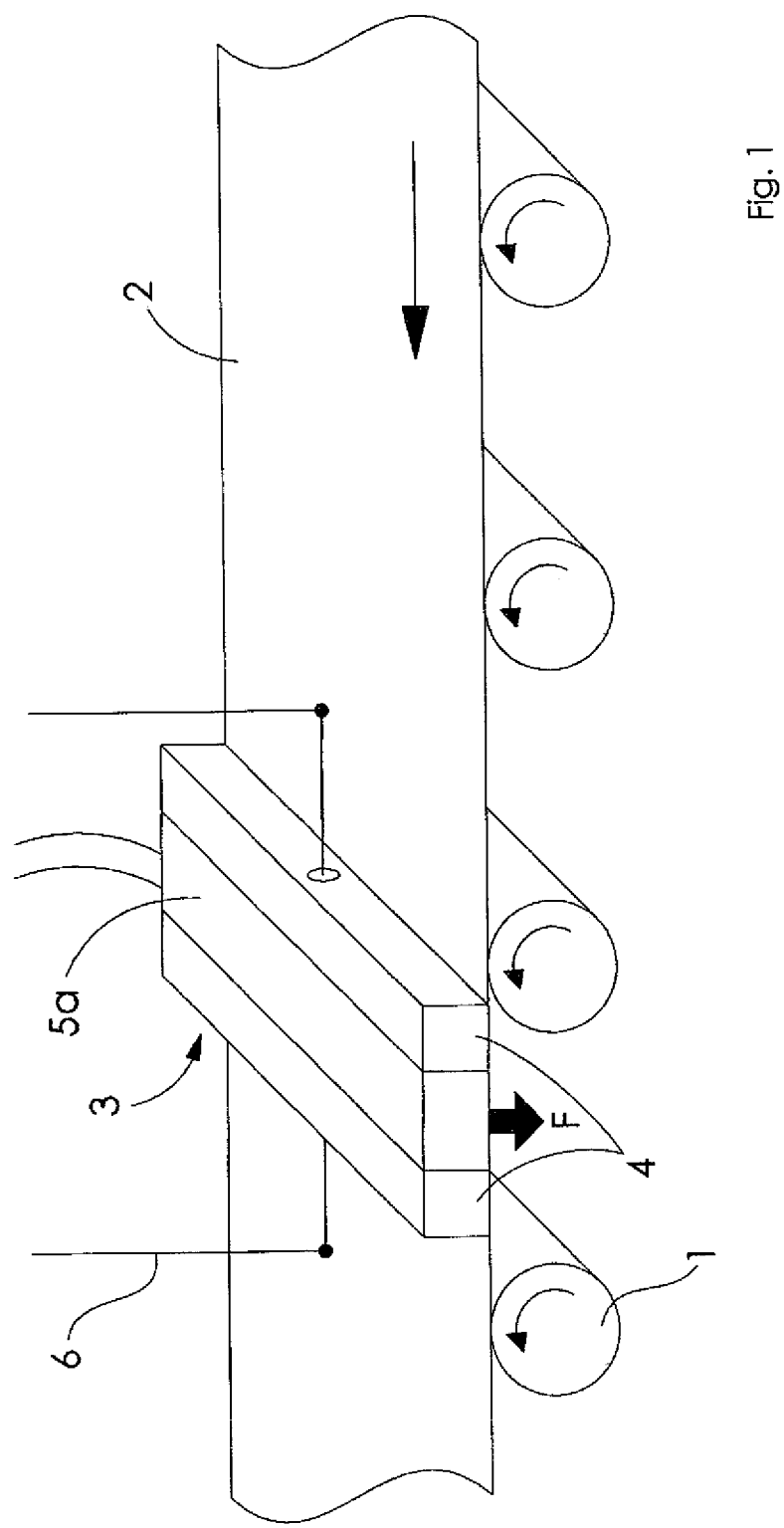
FIG. 1 schematically shows a device for applying oil.

FIG. 1 schematically shows a device for spraying oil. A belt material to be sprayed, e.g., a metal sheet, is guided via driven rollers 1. A sonotrode block 4 and spray nozzles 5a are contained in the work unit 3. The sonotrode block 4 generates an ultrasonic levitation force field between its underside and the surface 2 of the belt material. The work unit 3 is suspended on a movable suspension 6 and on the basis of its own weight, presses on the belt material, i.e., in this example, the gravitational force is used as a means of pushing, but it could also be a mechanical spring or other similarly acting means. An opposing force is built up by the ultrasonic levitation force field so that the work unit 3 floats in a predetermined distance above the surface 2 of the belt material. This distance can be set very precisely by means of sonotrode power and then remains constant to the extent that the pushing force is not changed. In this respect, the use of gravity is a simple, inexpensive and reliable option to generate a defined and very constant force. The spray nozzles 5a thus always have a predetermined distance from the surface 2 of the belt material. It is to be especially noted that the ultrasonic levitation force field has no influence on the spray action of the nozzles 5a.

Figure 2:
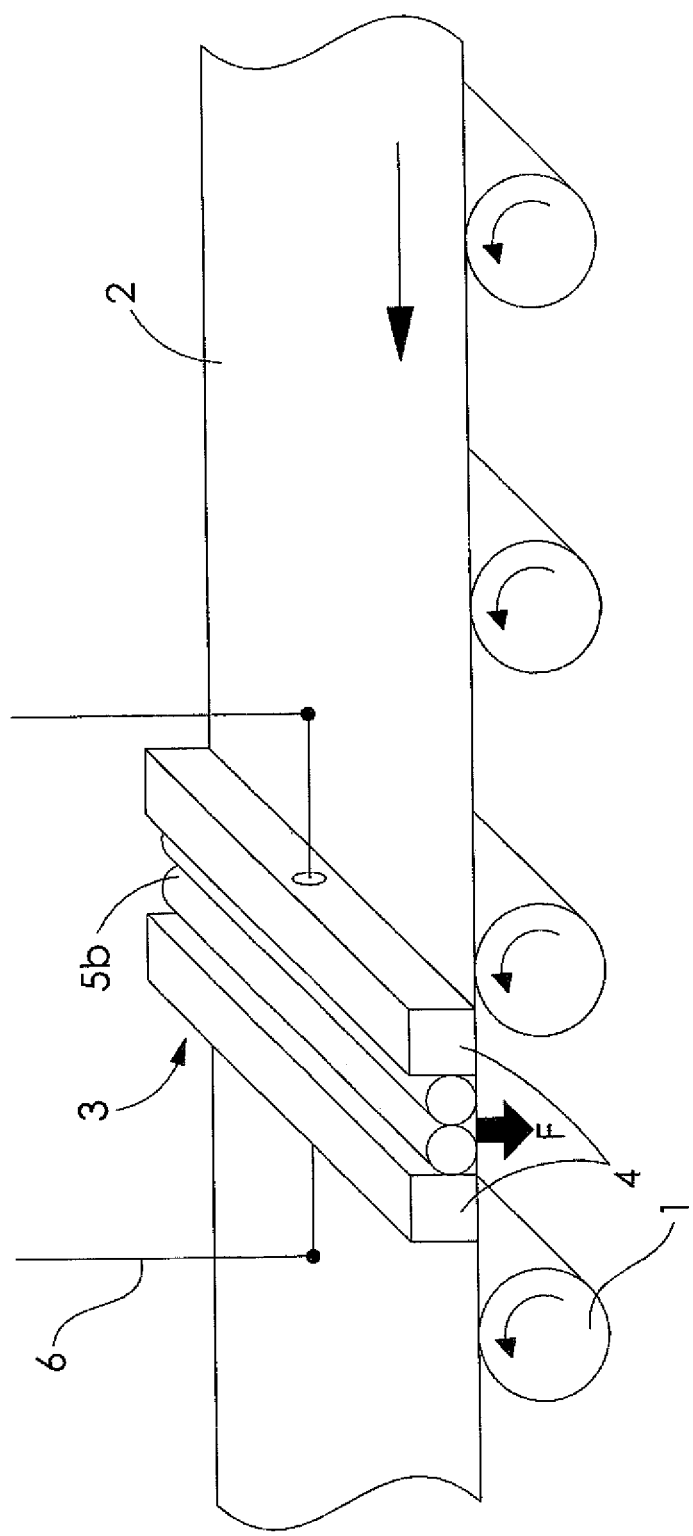
FIG. 2 schematically shows a device for applying powdered solids.

FIG. 2 schematically shows a device for applying etchants. The two illustrated rollers 5b generate a thin etchant film and transmit this to the surface 2 of the belt material. The sonotrode block 4 generates an ultrasonic levitation force field between its underside and the surface 2 of the belt material. The work unit 3 is suspended on a movable suspension 6 and on the basis of its own weight, presses on the surface 2 of the belt material. An opposing force is built up by the ultrasonic levitation force field so that the work unit 3 floats at a predetermined distance above the belt material. The distance can be set via the sonotrode power. A very uniform etching can thus be achieved. At the same time, the etchant film is not impaired by the non-contact ultrasonic levitation force field, i.e. neither smeared nor removed.

Figure 3:
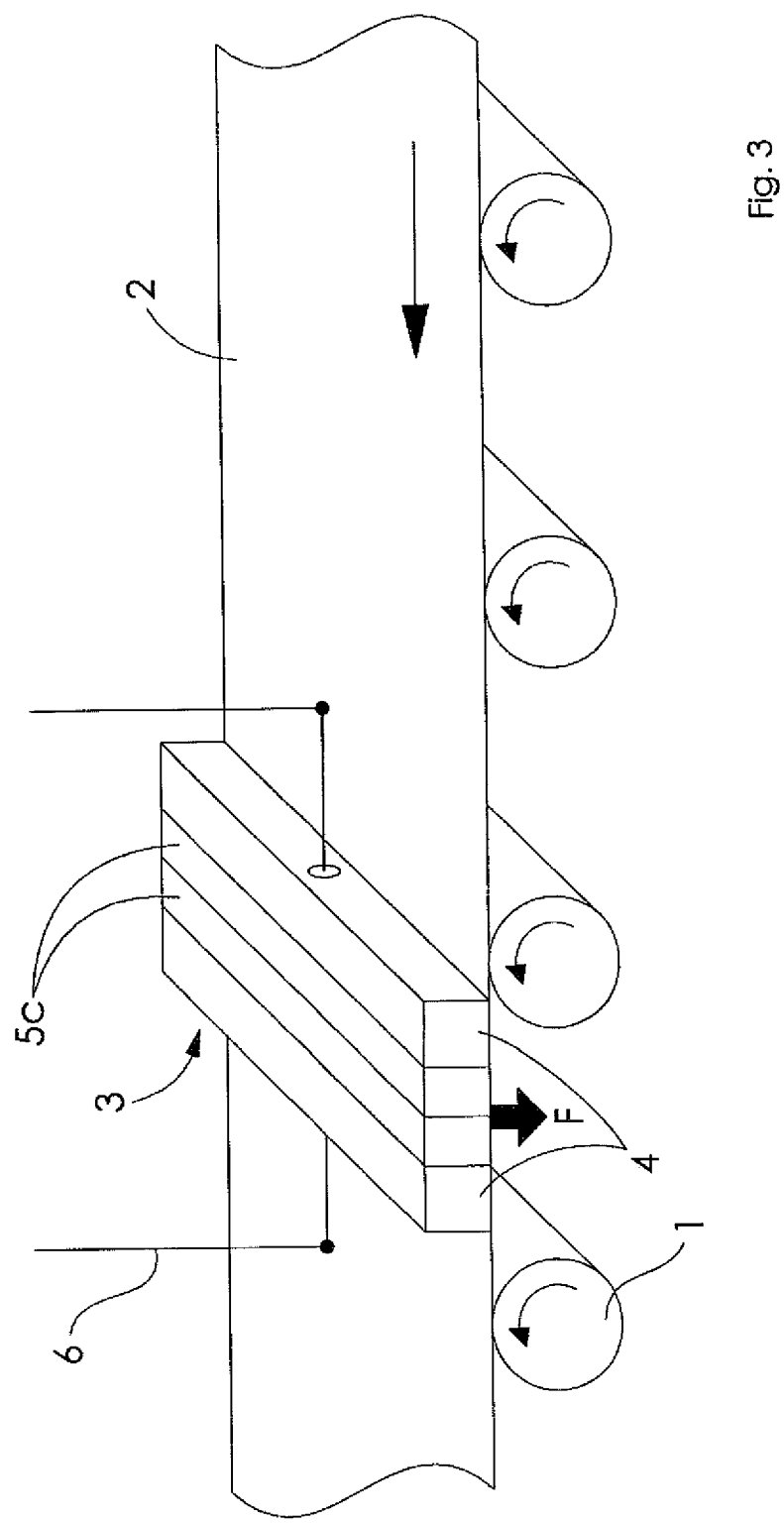
FIG. 3 schematically shows a device for etching the surface.

FIG. 3 schematically shows a device for applying powder. The sonotrode block 4 generates an ultrasonic levitation force field between its underside and the surface 2 of the belt material. The work unit 3 is suspended on a movable suspension 6 and on the basis of its own weight, presses on the surface of the belt material. An opposing force is built up by the ultrasonic levitation force field so that the work unit 3 floats at a predetermined distance above the belt material. The distance can be set via the sonotrode power. The powder is homogenized in the means of discharge for the powder shown with reference character 5c, in this embodiment, a chamber-like dosing device with a screw distributor and a blade dosing feeder, evenly distributed over the width of the belt material and applied in a uniform film thickness on the surface 2 of the belt material. The process is promoted by the constant distance between the rollers and the surface 2 of the belt material. It is to be especially noted that the ultrasonic levitation force field has no noticeable impact on the still loose powder layer.

Figure 4:
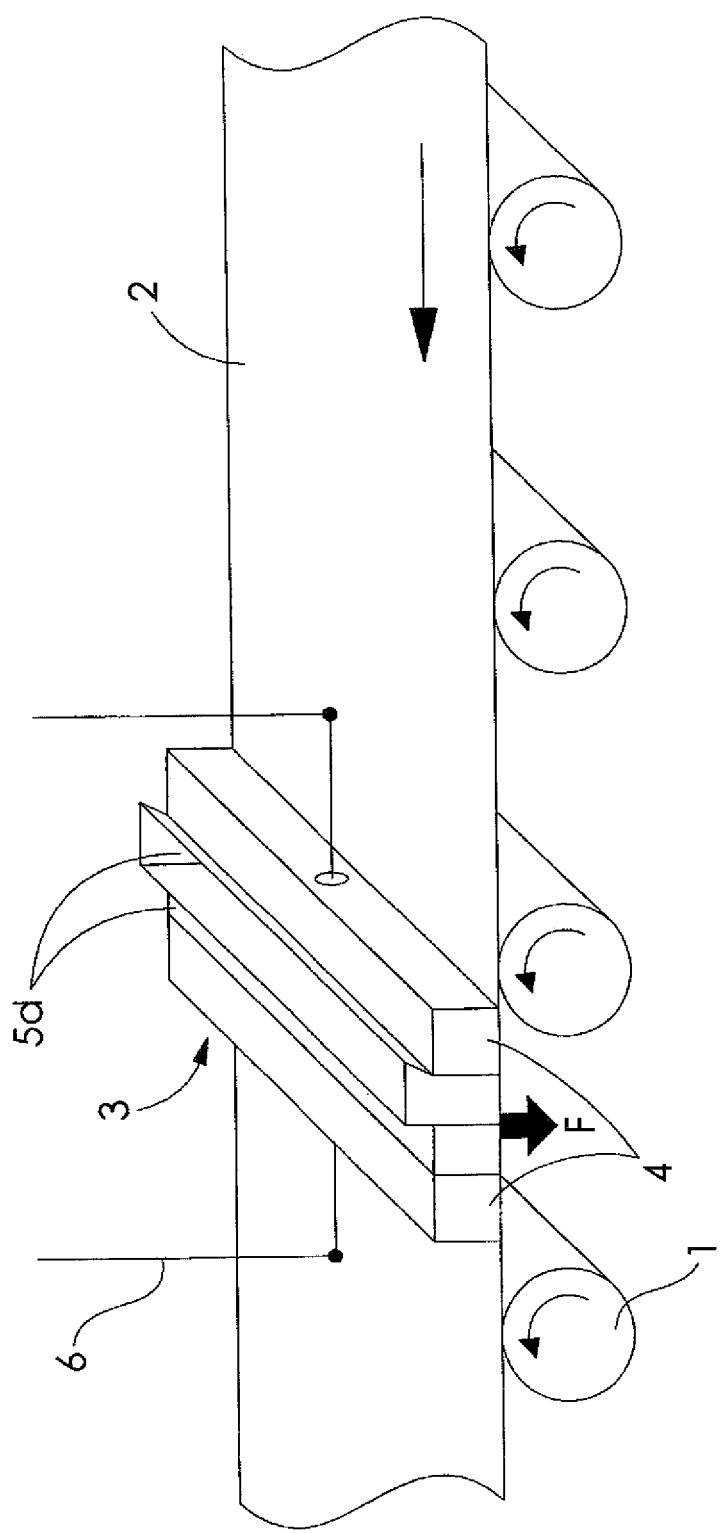
FIG. 4 schematically shows a device for curing varnishes.

FIG. 4 schematically shows a device for dispensing and curing varnishes. In this example, the devices for dispensing and curing the varnish are denoted with reference character 5d. The sonotrode block 4 generates an ultrasonic levitation force field between its underside and the surface 2 of the belt material. The work unit 3 is suspended on a movable suspension 6 and on the basis of its own weight, presses on the surface 2 of the belt material. An opposing force is built up by the ultrasonic levitation force field so that the work unit 3 floats in a predetermined distance above the belt material. The distance can be set via the sonotrode power.

The device has a discharge head which applies a uniform lacquer layer on the substrate. Based on the movement direction, a heat radiator for curing the lacquer is arranged behind it.

Figure 5:
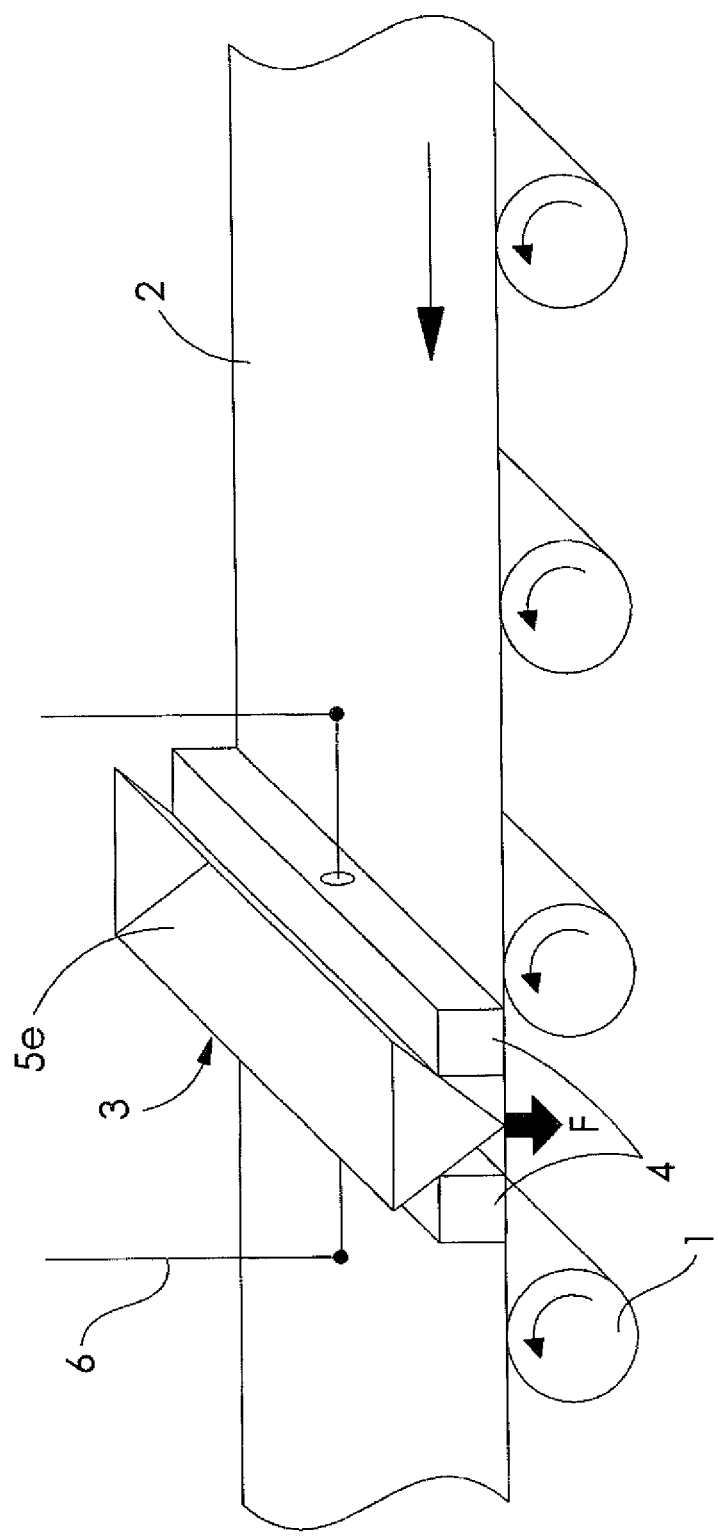
FIG. 5 schematically shows a device for applying aerosols.

FIG. 5 schematically shows a device for applying aerosols. In this embodiment, a device for generating aerosol is designated with reference character 5e. A sonotrode block 4 and the device 5e for aerosol generation and for discharging the aerosol are arranged in the work unit 3. The sonotrode block 4 generates an ultrasonic levitation force field between its underside and the surface 2 of the belt material. The work unit 3 is suspended on a movable suspension 6 and on the basis of its own weight, presses on the surface 2 of the belt material. An opposing force is built up by the ultrasonic levitation force field so that the work unit 3 floats at a predetermined distance above the belt material. The distance can be set via the sonotrode power. The ultrasonic field has no noticeable influence on the distribution of the aerosol.

Figure 6:
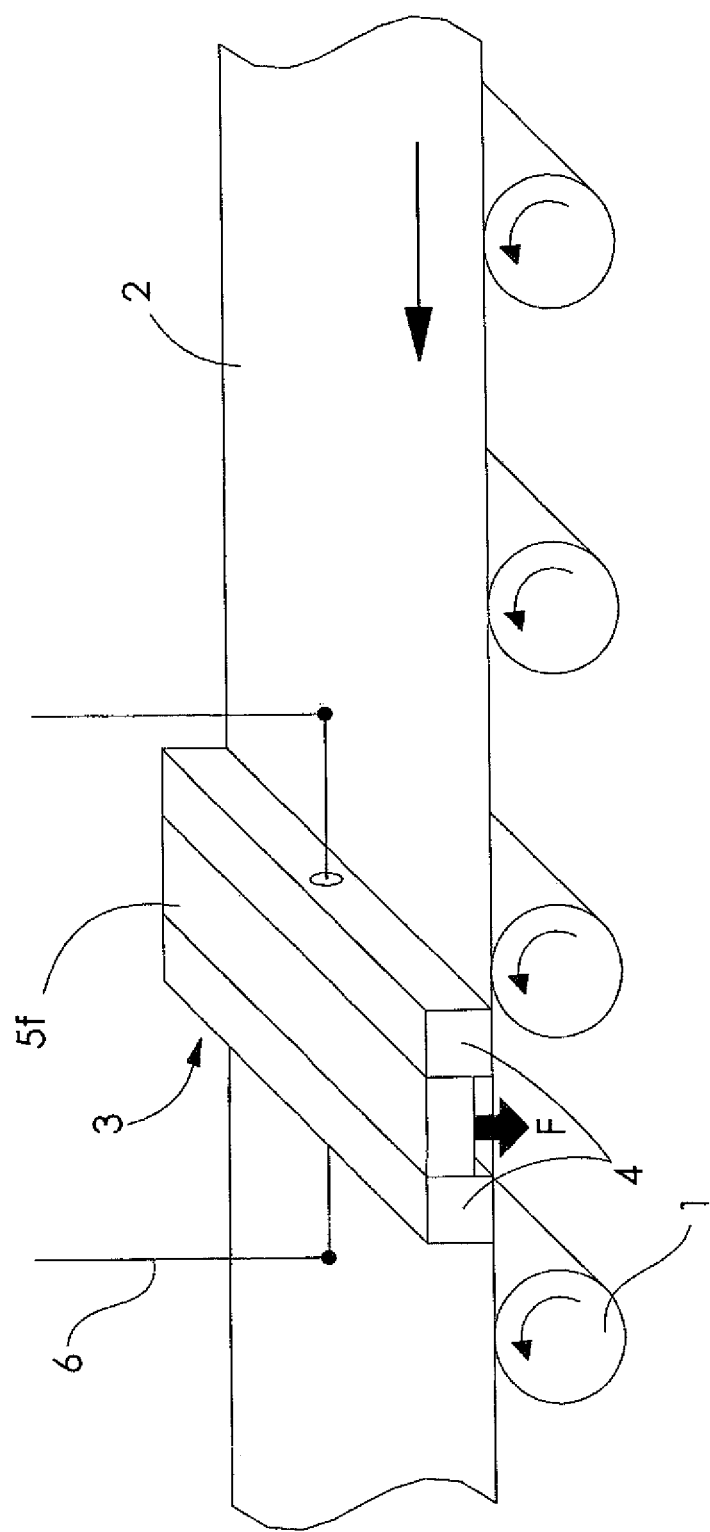
FIG. 6 schematically shows a welding device.

FIG. 6 schematically shows a welding device. In this example, the welding work unit is designated with reference character 5f. The sonotrode block 4 generates an ultrasonic levitation force field between its underside and the surface 2 of the belt material. The work unit 3 with the sonotrode block and the welding work unit 5f is suspended on a movable suspension device 6 and on the basis of its own weight, presses on the belt material. An opposing force is built up by the ultrasonic levitation force field so that the work unit 3 floats at a predetermined distance above the belt material. This distance can be set via the sonotrode power.

Figure 7:
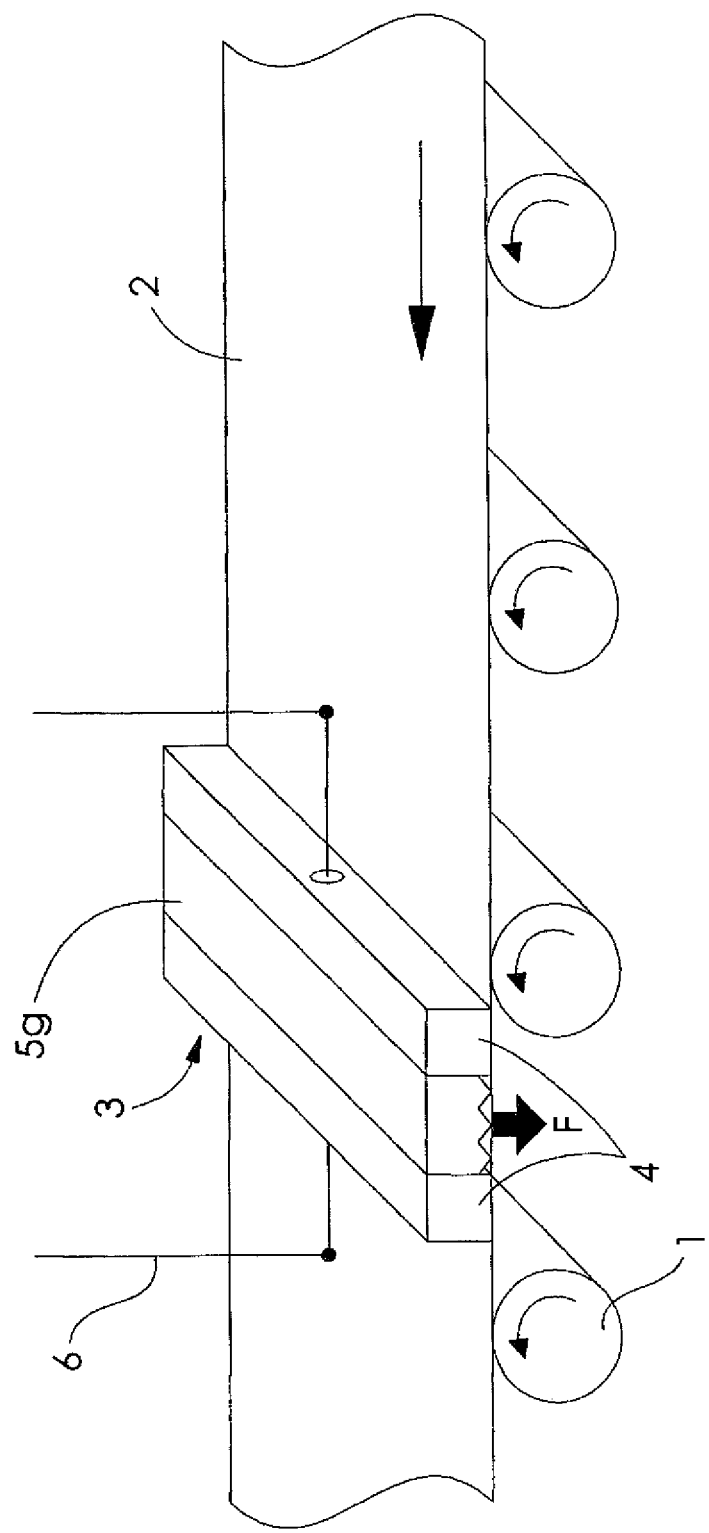
FIG. 7 schematically shows a device for the removal of surface material.

FIG. 7 schematically shows a device for the removal of surface material. In this example, the work unit for removing the surface material is designated with reference character 5a. In the work unit 3, a sonotrode block 4 and the work unit for removing the surface material are contained by means of a mechanical removal means. The sonotrode block 4 generates an ultrasonic levitation force field between its underside and the surface 2 of the belt material. The work unit 3 is suspended on a movable suspension 6 and on the basis of its own weight, presses on the belt material. An opposing force is built up by the ultrasonic levitation force field so that the work unit 3 floats at a predetermined distance above the belt material. The distance can be set via the sonotrode power. The surface is removed by an operating agent with a rough surface such as sandpaper. A planing device with rotating blades can also be used. The very constant height of the rotating blades removes a precisely adjustable material layer uniformly.

Figure 8:
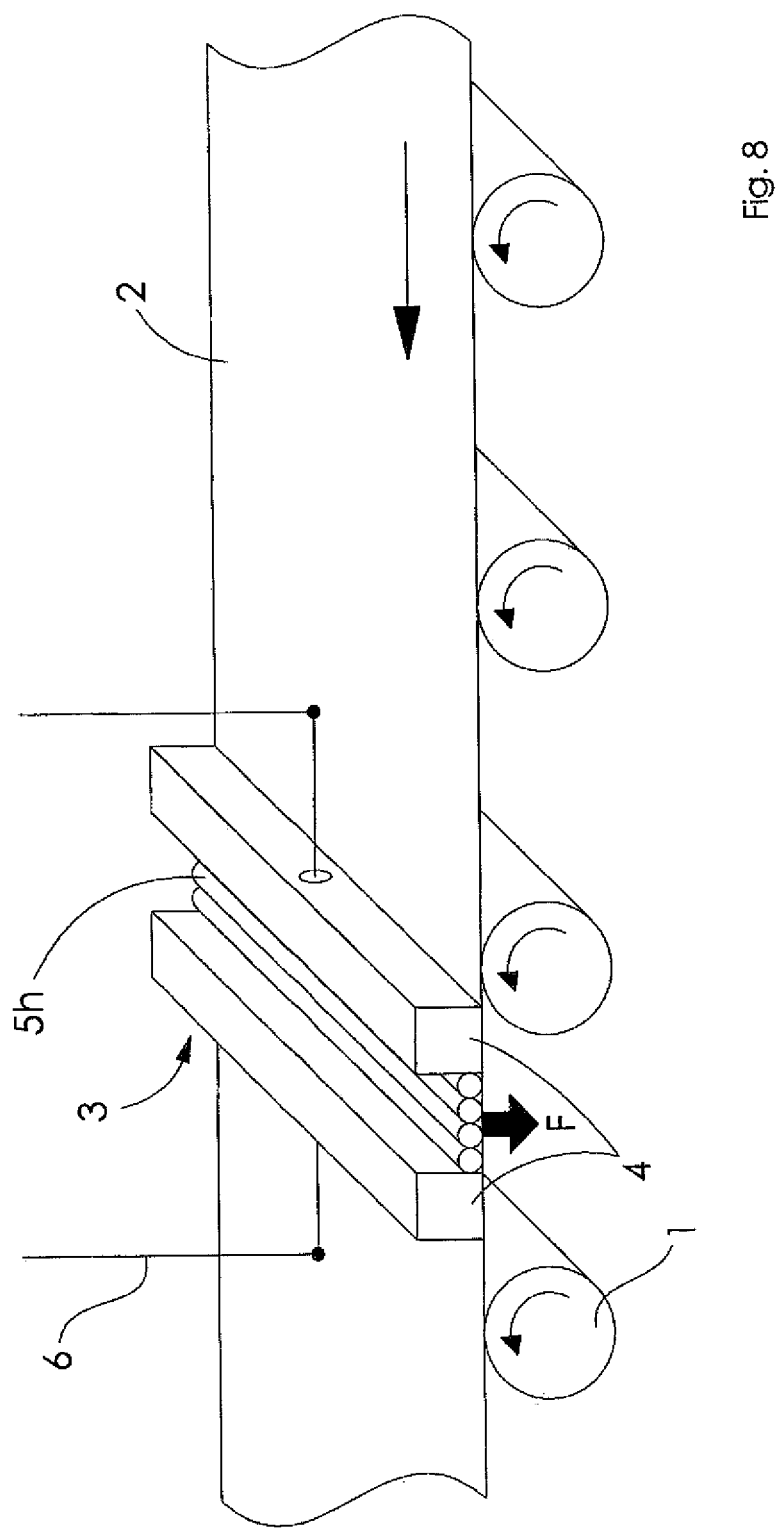
FIG. 8 schematically shows a cleaning device.

FIG. 8 schematically shows a cleaning apparatus. In this example, the work unit for dispensing a cleaning agent is designated with reference character 5h. A sonotrode block 4 and the cleaning device are contained in the work unit 3. The sonotrode block 4 generates an ultrasonic levitation force field between its underside and the surface 2 of the belt material. The work unit 3 is suspended on a movable suspension 6 and on the basis of its own weight, presses on the belt material. An opposing force is built up by the ultrasonic levitation force field so that the work unit 3 floats at a predetermined distance above the belt material. The distance can be set via the sonotrode power. The arrangement of the work rollers for various stages of cleaning and the rollers for receiving the spent cleaning agent can be designed as desired. The rollers can rotate in different directions.

Figure 9:
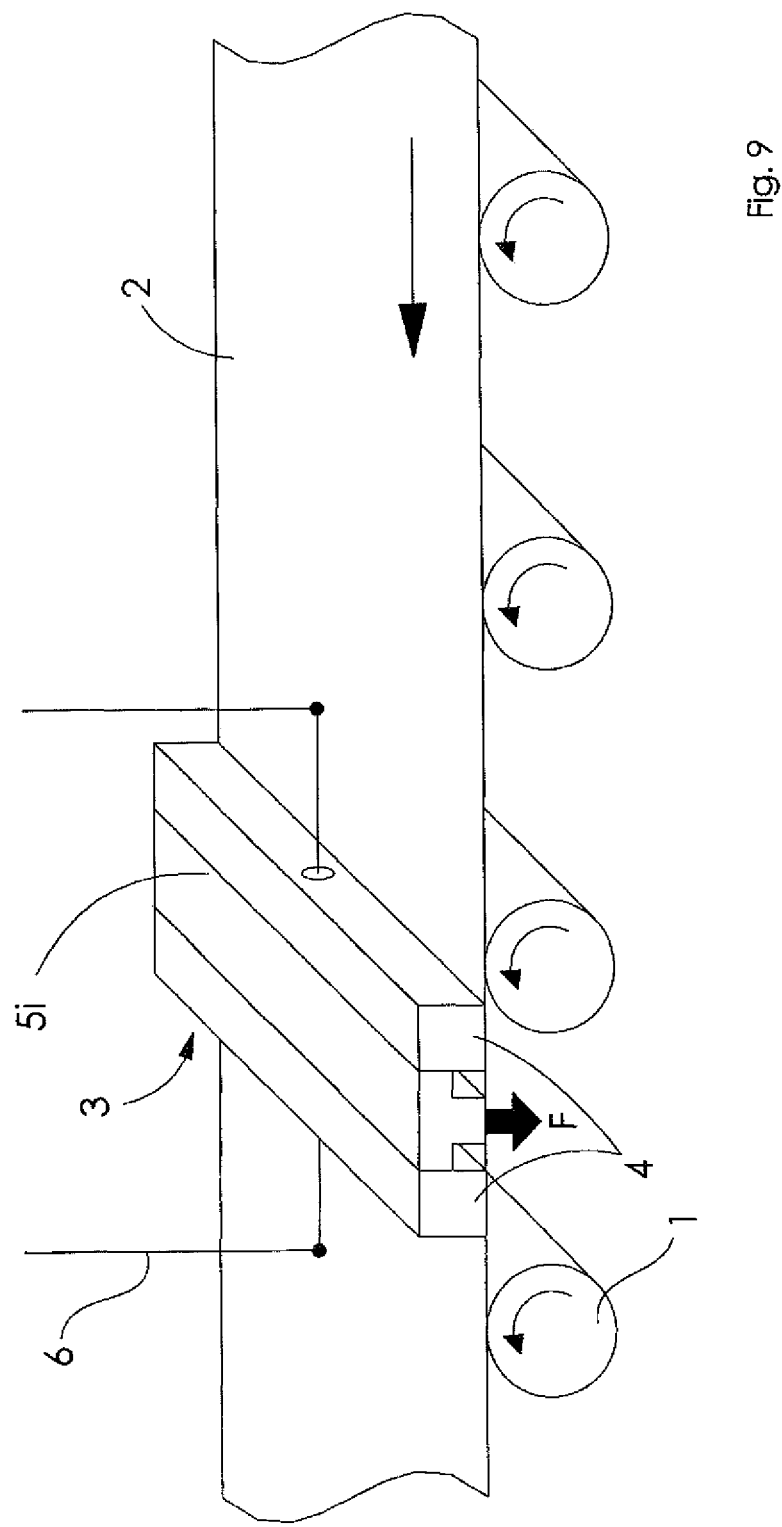
FIG. 9 schematically shows a device for laser-plasma separation.

FIG. 9 schematically shows a device for laser-plasma separation. The cutting heads of the laser plasma work unit move in the boxes designated with reference character 5i. The sonotrode block 4 generates an ultrasonic levitation force field between its underside and the surface 2 of the belt material. The work unit 3 is suspended on a movable suspension 6 and on the basis of its own weight, presses on the belt material. An opposing force is built up by the ultrasonic levitation force field so that the work unit 3 floats at a predetermined distance above the belt material. The uniform and defined distance leads to a high quality of the cut. Cutting residues do not impair the surface quality after cutting because the system floats without contact above the belt.

FIGS. 1 to 9 show only by way of example that different devices for surface treatment or processing can be created according to the teaching of the invention. In the examples given, the material to be processed is guided past the work unit. It is clear that the work unit can also be guided over the surface of a large-area workpiece by the same principle. Fundamentally, it should be noted that the ultrasonic levitation force field has a significant negative impact on the respective work process in none of the 9 different cases of application.

What is claimed is:

1. A device for the treatment or processing of a workpiece surface, said device comprising:
    a work unit comprising an actuator and at least one sonotrode mechanically rigidly connected to the actuator, said actuator being adapted to act on or process the workpiece surface, said at least one sonotrode having a sound radiating surface,
    a movable positioning device coupled to the work unit to suspend the work unit opposite to the workpiece surface, said positioning device being movable by actuating means of the positioning device or by a gravitational force of the work unit so that the work unit is urged with a predetermined force in a direction of the workpiece surface,
    an optical sensor arranged on the work unit and adapted to provide an image signal from the workpiece surface being treated or processed for process monitoring or process control,
    wherein the sound radiating surface of the sonotrode generates ultrasonic vibrations so that in the presence of a gaseous medium between the workpiece surface and the sound radiating surface of the sonotrode an ultrasonic levitation force field acts, which generates a force in opposition to the predetermined force, so that the work unit is suspended spaced apart from the workpiece surface,
    wherein the actuator is configured to apply liquid, pasty, powdery or aerosol-like media on the material surface that remains on the material surface for treatment of the material surface or generate electric fields, magnetic fields, electromagnetic fields or a plasma on the workpiece surface so as to change the surface of the workpiece.

2. The device of claim 1, wherein the process monitoring sensors are capacitive sensors which measure changes in capacitance of the workpiece surface caused by a treatment or processing of the workpiece surface, and generate electrical measurement signals commensurate with the changes in capacitance.

3. The device of claim 1, wherein the process monitoring sensors are inductive sensors which measure changes in inductance of the workpiece surface caused by a treatment or processing of the surface and generate electrical measurement signals commensurate with the changes in inductance.

4. The device of claim 1, wherein the process monitoring sensors are provided in front of and behind the work unit relative to a direction of movement of the workpiece.

5. The device of claim 1, further comprising a further work unit, wherein the process monitoring sensors are provided behind the work unit and the further work unit is provided behind the process monitoring sensors.

6. The device of claim 1, further comprising a controller adapted to control a distance between the workpiece surface and the work unit by changing an energy of the ultrasonic vibrations.

\* \* \* \* \*